(12) United States Patent
Xie

(10) Patent No.: US 9,472,668 B2
(45) Date of Patent: Oct. 18, 2016

(54) SEMICONDUCTOR DEVICE AND FABRICATION METHOD THEREOF

(71) Applicant: Semiconductor Manufacturing International (Shanghai) Corporation, Shanghai (CN)

(72) Inventor: Xinyun Xie, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/799,879

(22) Filed: Jul. 15, 2015

(65) Prior Publication Data

US 2016/0020325 A1    Jan. 21, 2016

(30) Foreign Application Priority Data

Jul. 21, 2014 (CN) .......................... 2014-10347625

(51) Int. Cl.
*H01L 21/8238* (2006.01)
*H01L 27/092* (2006.01)
*H01L 29/78* (2006.01)
*H01L 29/66* (2006.01)
*H01L 21/324* (2006.01)
*H01L 29/167* (2006.01)
*H01L 29/08* (2006.01)
*H01L 29/45* (2006.01)
*H01L 21/3065* (2006.01)
(Continued)

(52) U.S. Cl.
CPC ....... *H01L 29/7848* (2013.01); *H01L 21/0262* (2013.01); *H01L 21/02532* (2013.01); *H01L 21/02576* (2013.01); *H01L 21/02639* (2013.01); *H01L 21/308* (2013.01); *H01L 21/3065* (2013.01); *H01L 21/30608* (2013.01); *H01L 21/324* (2013.01); *H01L 21/823807* (2013.01); *H01L 21/823814* (2013.01); *H01L 27/092* (2013.01); *H01L 29/0847* (2013.01); *H01L 29/165* (2013.01); *H01L 29/167* (2013.01); *H01L 29/1608* (2013.01); *H01L 29/45* (2013.01); *H01L 29/665* (2013.01); *H01L 29/66636* (2013.01); *H01L 21/823418* (2013.01); *H01L 27/0922* (2013.01)

(58) Field of Classification Search
CPC ................... H01L 27/0922; H01L 21/823814
USPC .......................... 438/222, 226, 300; 257/369
See application file for complete search history.

(56) References Cited

U.S. PATENT DOCUMENTS 5,312,506 A  *  5/1994  Omino ................... C30B 11/002
                                                              117/223
2011/0147828 A1*  6/2011  Murthy ............. H01L 21/02057
                                                              257/327

(Continued)

*Primary Examiner* — George Fourson, III
(74) *Attorney, Agent, or Firm* — Anova Law Group, PLLC

(57) ABSTRACT

The present disclosure provides a semiconductor fabrication method. The method includes providing a semiconductor substrate having first regions and second regions; providing a first gate structure on a first region of the semiconductor substrate, and a second gate structure on a second region of the semiconductor substrate; and forming first trenches in the first region at both sides of the first gate structure. The method further includes forming a first stress layer in the first trenches and a first bumping stress layer on the first stress layer; forming second trenches in a second region at both sides of the second gate structure; and forming a second stress layer in the second trenches and a second bumping stress layer on the second stress layer.

22 Claims, 7 Drawing Sheets

| | | |
|---|---|---|
| (51) | Int. Cl. | |
| | *H01L 21/306* | (2006.01) |
| | *H01L 21/308* | (2006.01) |
| | *H01L 29/165* | (2006.01) |
| | *H01L 29/16* | (2006.01) |
| | *H01L 21/02* | (2006.01) |
| | *H01L 21/8234* | (2006.01) |

(56) References Cited

U.S. PATENT DOCUMENTS

2013/0069123 A1\* 3/2013 Illgen .............. H01L 21/823807
 257/288
2014/0217519 A1\* 8/2014 Qin ..................... H01L 29/7833
 257/408

\* cited by examiner

SEMICONDUCTOR DEVICE AND FABRICATION METHOD THEREOF

CROSS-REFERENCES TO RELATED APPLICATIONS

This application claims the priority of Chinese Patent Application No. 201410347625.5 filed on Jul. 21, 2014, the entire content of which is incorporated herein by reference.

FIELD OF THE DISCLOSURE

The present disclosure generally relates to the field of semiconductor technology, more particularly, relates to semiconductor devices and fabrication methods.

BACKGROUND

Advance in semiconductor technology enables the dimensions of semiconductor devices to decrease. As the dimensions of semiconductor devices decrease, contact resistances of a MOS transistor are having increasing impact on the performance of the MOS transistor and/or even the entire semiconductor chip. To improve the performance of semiconductor chips, contact resistances of a MOS transistor need to be reduced. Among the contact resistances in a MOS transistor, the contact resistance between the source/drain and the corresponding conductive plug can be undesirably high due to the relatively small areas of the source and the drain regions. Thus, the relatively high contact resistance may cause the performance of the MOS transistor to be adversely affected and significantly slow down the operating speed of the semiconductor device/chip.

Silicide layer (metal-semiconductor (silicon) compound) formed on the surfaces of the source and drain regions through a salicide (self-aligned silicide layer) process can effectively reduce the contact resistance between the source/drain and the corresponding conductive plug. In existing semiconductor technologies, the self-aligned silicide layer is often formed by evaporating or sputtering a metal layer on poly-silicon. A thermal annealing process is often performed after the evaporation/sputtering process to enable the formation of silicide layer through the reaction between the metal and the substrate material (i.e., the poly-silicon). Then, unreacted metal layer is removed.

As the dimensions of the semiconductor devices further continue to decrease, the contact resistances of transistors are having more prominent impact on the performance of the semiconductor devices. Since the contact resistances between the source and drain regions and the corresponding silicide layers account for a main portion of the total contact resistances of a transistor, the contact resistance between the source/drain and the corresponding silicide layer needs to be further reduced to reduce the contact resistances of the transistor.

BRIEF SUMMARY OF THE DISCLOSURE

One aspect of the present disclosure provides a semiconductor fabrication method. The semiconductor fabrication method includes providing a semiconductor substrate having first regions and second regions; providing a first gate structure on a first region of the semiconductor substrate, and a second gate structure on a second region of the semiconductor substrate; and forming first trenches in the first region at both sides of the first gate structure. The method also includes forming a first stress layer in the first trenches and a first bumping stress layer on the first stress layer, wherein the first bumping stress layer is doped with first dopants; forming second trenches in a second region at both sides of the second gate structure; and forming a second stress layer in the second trenches and a second bumping stress layer on the second stress layer, wherein the second bumping stress layer is doped with second dopants. The method further includes forming a metal layer on the first bumping stress layer and the second bumping stress layer; and performing a thermal annealing process such that the metal layer reacts with the first bumping stress layer to form a first silicide layer on the first bumping stress layer and the metal layer reacts with the second bumping stress layer to form a second silicide layer on the second bumping stress layer.

Another aspect of the present disclosure provides a semiconductor device. The semiconductor device includes a semiconductor substrate having first regions, second regions, a first gate structure on a first region of the semiconductor substrate, and a second gate structure on a second region of the semiconductor substrate; first trenches in a first region at both sides of each first gate structure; and a first stress layer filling up the first trenches and a first bumping stress layer on the first stress layer, wherein the first bumping stress layer is doped with first dopants. The semiconductor device also includes second trenches in a second region at both sides of each second gate structure; a second stress layer filling up the second trenches and a first bumping stress layer on the first stress layer, wherein the second bumping stress layer is doped with second dopants; and a metal layer on the first bumping stress layer and the second bumping stress layer. The semiconductor device further includes a first silicide layer on the first bumping stress layer and a second silicide layer on the second bumping stress layer. The first silicide layer and the second silicide layer are formed by: providing a semiconductor substrate having first regions and second regions; providing a first gate structure on a first region of the semiconductor substrate, and a second gate structure on a second region of the semiconductor substrate; forming first trenches in the first region at both sides of the first gate structure; forming a first stress layer in the first trenches and a first bumping stress layer on the first stress layer, wherein the first bumping stress layer is doped with first dopants; forming second trenches in a second region at both sides of the second gate structure; forming a second stress layer in the second trenches and a second bumping stress layer on the second stress layer, wherein the second bumping stress layer is doped with second dopants; and forming the metal layer on the first bumping stress layer and the second bumping stress layer; and performing the thermal annealing process to enable the metal layer to react with the first bumping stress layer to form the first silicide layer on the first bumping stress layer, and enable the metal layer to react with the second bumping stress layer to form the second silicide layer on the second bumping stress layer.

Other aspects or embodiments of the present disclosure can be understood by those skilled in the art in light of the description, the claims, and the drawings of the present disclosure

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

The disclosed method and device are directed to semiconductor devices such as transistor devices with improved performance. For example, contact resistances in the disclosed semiconductor devices may be decreased and improved.

Contact resistances in existing transistors need to be further reduced. Since the contact resistance between the source/drain and the corresponding silicide layer account for a main portion of the contact resistances of the transistor, the contact resistances of a transistor can be reduced by further reducing the contact resistance between the source/drain and the corresponding silicide layer.

It has been found that, the contact resistance between a source/drain and the corresponding silicide layer is mainly determined by the Schottky barrier between the source/drain and the corresponding silicide layer. Thus, the contact resistance between a source/drain and the corresponding silicide layer can be decreased by reducing the height of the Schottky barrier between the source/drain and the corresponding silicide layer.

In various embodiments of the present disclosure, before the silicide layer is formed on the source and drain regions of an NMOS/a PMOS transistor, first dopants are doped into the source and drain regions of the PMOS transistor, and second dopants are doped into the source and drain regions of the NMOS transistor. The silicide layer is further formed on the source and drain regions of the NMOS/PMOS transistor. The first dopants can reduce the Schottky barrier between the first silicide layer and the source/drain region of the PMOS transistor, and the second dopants can reduce the Schottky barrier between the second silicide layer and the source/drain region of the NMOS transistor. Thus, contact resistances in the PMOS transistors and/or NMOS transistors can be reduced.

Figure 11:
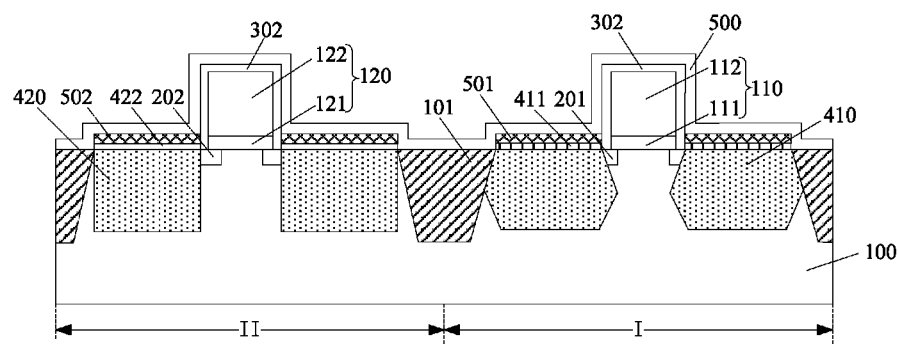
Figure 12:
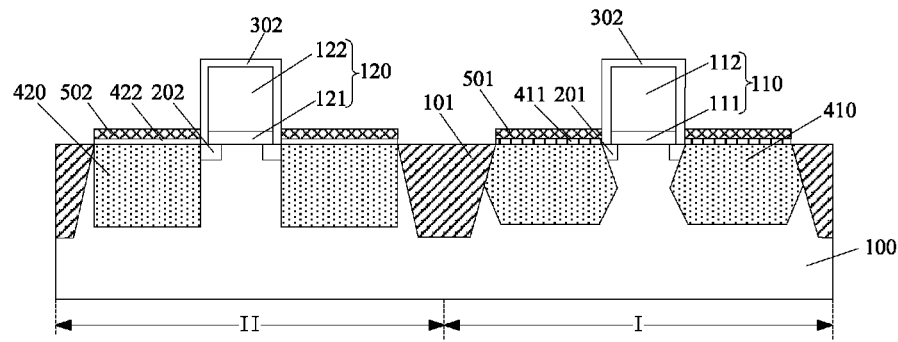
Figure 13:
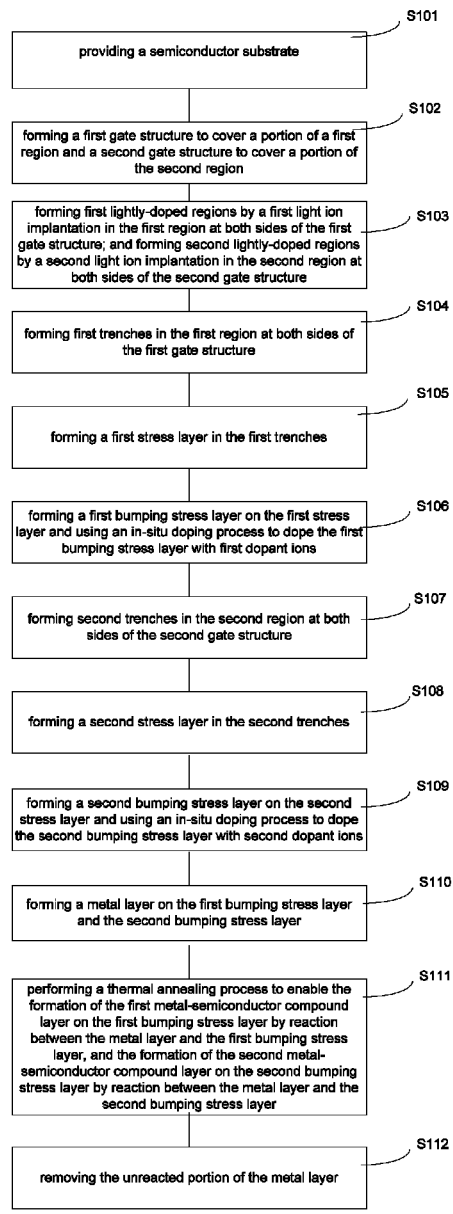
FIG. 13 illustrates an exemplary fabrication process of a transistor consistent with various disclosed embodiments.

Embodiments are now illustrated to exemplify the present disclosure. FIG. 13 illustrates an exemplary fabrication process of transistors with stress layers and FIGS. 1-12 illustrate exemplary transistors corresponding to various stages of an exemplary fabrication process of stress layers.

Figure 1:
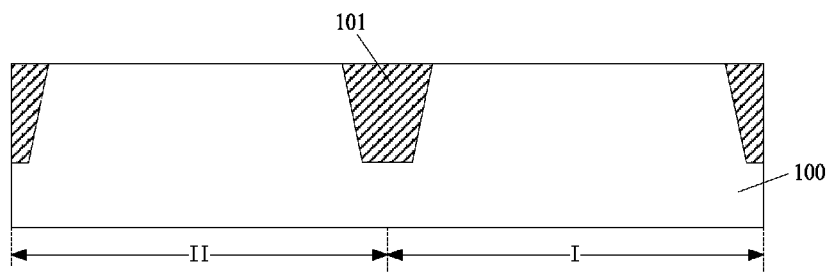
FIGS. 1-12 illustrate an exemplary transistor corresponding to certain stages of an exemplary fabrication process consistent with various disclosed embodiments.

As shown in FIG. 13, at the beginning of the fabrication process, a semiconductor substrate is provided (S101). FIG. 1 illustrates a corresponding semiconductor structure.

As shown in FIG. 1, a substrate 200 can be provided.

The semiconductor substrate 100 can be made of Si, Ge, SiGe, GaAs and/or other suitable semiconductor materials. The semiconductor substrate 100 can be a bulk material, or can have a composite structure such as SOI (silicon on insulator). Those skilled in the art can select the type of the semiconductor substrate 100 based on the semiconductor devices to be formed on the semiconductor substrate 100. Thus, the type of the semiconductor substrate 100 should not limit the scope of the present disclosure. In one embodiment, the semiconductor substrate 100 can be made of single-crystal Si.

In one embodiment, the semiconductor substrate 100 can include first regions I, second regions II, and shallow trench isolation (STI) structures 101. An STI structure 101 can be formed between a first region I and a second region II. A transistor can be subsequently formed on a first region I, and another transistor can be subsequently formed on a second region II. In certain other embodiments of the present disclosure, the semiconductor substrate 100 can also include one or more regions.

In one embodiment, a P-type FET (field effect transistor) can be formed on the first regions I, and an N-type FET can be formed on the second regions II.

Figure 2:
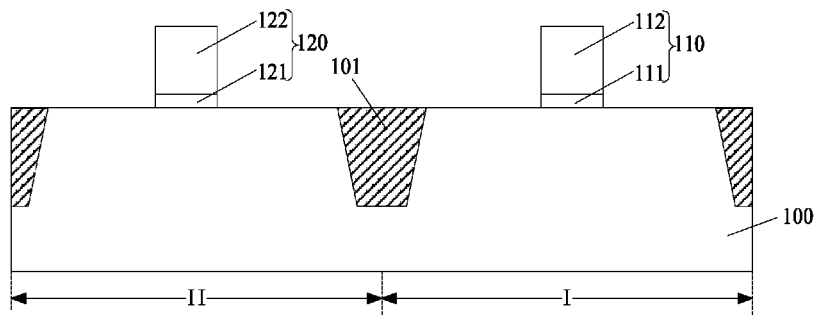

Returning to FIG. 13, after a substrate is provided, a first gate structure is formed to cover a portion of a first region and a second gate structure is formed to cover a portion of a second region (S102). FIG. 2 illustrates a corresponding semiconductor structure.

As shown in FIG. 2, a first gate structure 110 can be formed to cover a portion of a first region I and a second gate structure 120 can be formed to cover a portion of a second region II.

In one embodiment, a first gate structure 110 may include a first gate dielectric layer 111 on the substrate 100 and a first gate electrode 112 on the first gate dielectric layer 111. A second gate structure 120 may include a second gate dielectric layer 121 on the substrate 100 and a second gate electrode 122 on the second gate dielectric layer 121. The first gate electrode 112 and the second gate electrode 122 can be made of a same material, such as poly-silicon, Al, W, Ti, TiN, Ta, and/or tantalum carbide. The first gate dielectric layer 111 and the second gate dielectric layer 121 can be made of a high-K dielectric material such as silicon dioxide, hafnium oxide, zirconium oxide, aluminum oxide, hafnium silicon oxide, and/or silicon zirconia. The first gate structure 110 can be the gate structure of a subsequently-formed transistor on the first region I. The second gate structure 120 can be the gate structure of a subsequently-formed transistor on the second region II. In one embodiment, the first gate dielectric layer 111 and the second gate dielectric layer 121 can be made of silicon dioxide. The first gate electrodes 112 and the second gate electrodes 122 can be made of poly-silicon.

In certain other embodiments of the present disclosure, the first gate structure 110 and the second gate structure 120 can be dummy gate structures. A first gate structure 110 formed on a first region I can include a first dummy gate dielectric layer 111 on the substrate 100 and a first dummy gate electrode 112 on the dummy gate dielectric layer 111. A second gate structure 120 formed on a second region II can include a second dummy gate dielectric layer 121 on the substrate 100 and a second dummy gate electrode 122 on the dummy gate dielectric layer 121. The first dummy gate dielectric layer 111 and the second dummy gate dielectric layer 121 can be made of silicon dioxide. The first dummy gate electrode 112 and the second dummy gate electrode 122 can be made of poly-silicon. A subsequent gate-last process can be used to form metal gate electrode structures to replace the first gate structure 110 and the second gate structure 120.

In one embodiment, for illustrative purposes, one transistor can be formed on a first region I and one transistor formed on a second region II. Thus, only one first gate structure 110 can be formed on the first region I, and only one second gate structure 120 can be formed on the second region II. In certain other embodiments of the present disclosure, more than one first gate structures can be formed on a first region I, and more than one second gate structures can be formed on a second region II. Each first region I and each second region II can be isolated from other active regions (not shown) by certain STI structures in the semiconductor substrate 100.

To form the first gate structure 110 and the second gate structure 120, a gate dielectric material layer can be formed on the semiconductor substrate 100 and the STI structure 101, and a gate electrode material layer can be formed on the gate dielectric material layer. The gate dielectric material layer and the gate electrode material layer can be etched to form the first gate structure 110 on the first region I and the second gate structure 120 on the second region II.

In certain other embodiments of the present disclosure, after the formations of the first gate structure 110 and the second gate structure 120, an oxidation treatment can be performed on the surfaces of the semiconductor substrate 100, the first gate structure 110, and the second gate structure 120 to form a repair layer. The repair layer can be used to repair damages on the surfaces of the first gate structures 110, the second gate structures 120, and the semiconductor substrate 100.

In certain other embodiments of the present disclosure, after the formations of the first gate structure 110 and the second gate structure 120, sidewall spacers can be formed on the sidewalls of the first gate structure 110 and the second gate structure 120. The sidewall spacers can provide protection for the first gate structure 110 and the second gate structure 120 in subsequent fabrication steps.

Figure 3:
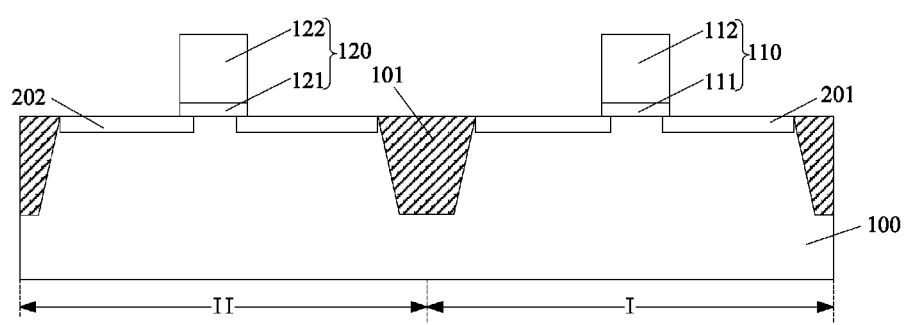

Returning to FIG. 13, after the first gate structure and the second gate structure are formed, first slightly-doped regions can be formed by a first light ion implantation in the first region at both sides of the first gate structure, and second lightly-doped regions can be formed by a second light ion implantation in the second region at both sides of the second gate structure (S103). FIG. 3 illustrates a corresponding semiconductor structure.

As shown in FIG. 3, a first light ion implantation can be performed in the first region I of the semiconductor structure 100 at both sides of the first gate structure 110 to form first lightly-doped regions 201; and a second light ion implantation can be performed in the second region II of the semiconductor structure 100 at both sides of the second gate structure 120 to form second lightly-doped regions 202.

In one embodiment, a P-type FET can be formed subsequently on the first regions I and the dopants (i.e., dopant ions) doped by the first light ion implantation can be P-type dopants, such as B and/or In. An N-type FET can be formed on the second regions II and the dopants doped by the second light ion implantation can be N-type dopants, such as As or P.

In certain other embodiments of the present disclosure, after the first light ion implantation and the second light ion implantation, a first pocket ion implantation can be performed in the first region I at both sides of the first gate structure 110, and a second pocket ion implantation can be performed in the second region II at both sides of the second gate structure 120. The implantation depth of the first pocket ion implantation and the second pocket ion implantation are each greater than the implantation depth of the first light ion implantation or the second light ion implantation. The dopants of the first pocket ion implantation can be of an opposite type to the dopants of the first light ion implantation, and the dopants of the second pocket ion implantation can be of an opposite type of the dopants of the second light ion implantation. Thus, the depletion regions near the bottom of the gate structure in the first lightly-doped region 201 and the depletion regions near the bottom of the gate structure in the second lightly-doped region 202 can be narrowed. Short-channel effects in transistors can be alleviated or reduced. After the first light ion implantation, the second light ion implantation, the first pocket ion implantation, and the second pocket ion implantation, a thermal annealing process can be performed to activate the implanted dopants/ions.

In certain other embodiments of the present disclosure, the implanted dopants can also be activated through a thermal annealing process performed in a later fabrication step for low-cost considerations.

Figure 4:
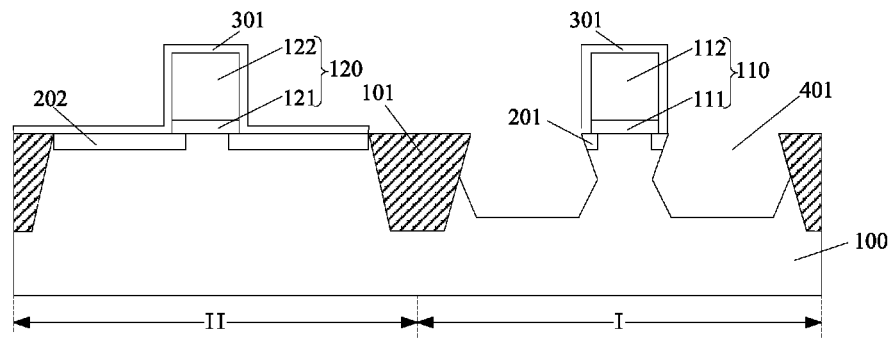

Returning to FIG. 13, after the first lightly-doped regions are formed by a first light ion implantation in the first region at both sides of the first gate structure, and the second lightly-doped regions are formed by a second light ion implantation in the second region at both sides of the second gate structure, first trenches are formed in the first region at both sides of the first gate structure (S104). FIG. 4 illustrates a corresponding semiconductor structure.

As shown in FIG. 4, first trenches 401 can be formed in the first region I at both sides of the first gate structure 110.

To form the first trenches 401, a first mask layer 301 can be formed to cover the second region II and the first gate structure 110. The first mask layer 301 can be used as the etch mask for etching portions of the first region I at both sides of the first gate structure 110 to form the first trenches 401.

In one embodiment, the surface crystal orientation of the semiconductor substrate 100 may be (100). A cross-section view of a sidewall of a trench 401 may have a "Σ" shape with respect to the surface of the semiconductor substrate 100. To form trenches 401, a dry etch process can be used to form "U"-shaped openings in the first region I at both sides of first gate structure 110 in the semiconductor substrate 100. A wet etch process can be used to further etch the openings. For example, the wet etch solution can be a TMAH (tetramethylammonium hydroxide) solution and/or a NaOH solution. Since the TMAH solution may have higher etch rates on crystal orientations of (100) and (110) than on crystal orientation (111), a trench 401 with "Σ"-shaped sidewalls can be formed. In certain other embodiments of the present disclosure, a trench 401 can also be formed by using only dry etch processes or only wet etch processes.

In certain other embodiments of the present disclosure, the semiconductor substrate 100 can also be made of a material with other crystal orientations. First trenches 401 with sidewalls of "U"-shaped or "V"-shaped cross-section views can be formed in the semiconductor substrate 100. Compared to a first trench 401 with "U"-shaped or "V"-shaped sidewalls, a first trench 401 with "Σ"-shaped sidewalls can have larger sidewall areas, and the distance between a sidewall and the corresponding channel region can be reduced. Thus, the subsequently-formed first stress layer in the first trenches 401 with Σ"-shaped sidewalls can be the source and drain regions of the corresponding gate structure, and provide greater stress to the channel region of the corresponding transistor. Carrier mobility in the channel of the semiconductor transistor can be improved.

Figure 5:
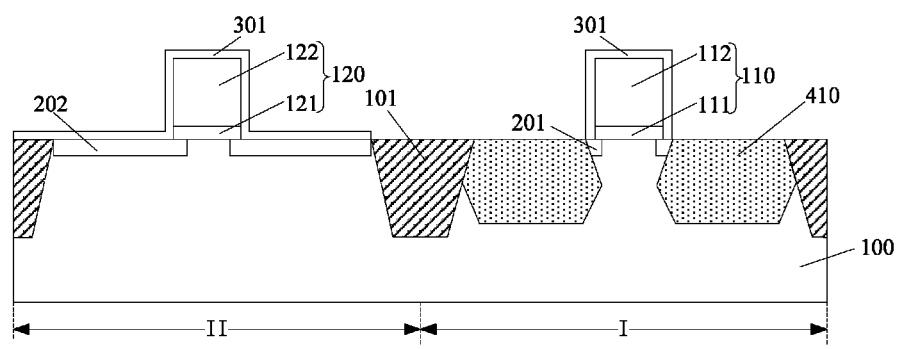

Returning to FIG. 13, after first trenches are formed in the first region I, a first stress layer is formed in the first trenches (S105). FIG. 5 illustrates a corresponding semiconductor structure.

As shown in FIG. 5, a first stress layer 410 can be formed in the first trench 401 (as shown in FIG. 4).

A selective deposition process can be used to form the first stress layer 410 in the first trenches 401.

In one embodiment, the first region I can be used for the formation of a P-type FET, and the first stress layer 410 can be made of SiGe. The first stress layer 410 can exert stress on the channel regions under the first gate structures 110 to improve hole mobility in the channel regions. The electrical properties and performance of the P-type FET can be improved accordingly. In one embodiment, a selective epitaxial deposition process can be used for form the first stress layer 410, made of SiGe, and the reactant gases of the selective epitaxial deposition process can include a silicon-source gas and a germanium-source gas. The silicon-source gas can be $SiH_4$ and/or $SiH_2Cl_2$, the germanium-source gas can be $GeH_4$. The reactant gases can also include HCl gas and $H_2$. The flow rate of the silicon-source gas, the germanium-source gas, and the HCl gas can each be about 10 scan (i.e., standard cubic centimeters per minute), to 1000 sccm; and the flow rate of the $H_2$ can be about 0.1 slm (i.e., standard liter per minute) to 50 slm.

In one embodiment, after the first stress layer 410 is formed by using the selective epitaxial deposition process, a heavy ion implantation can be performed on the first stress layer 410 to dope P-type dopants into the first stress layer 410 such that the first stress layer 410 can be doped with P-type dopants. The first stress layer 410 can be the source and drain region of the transistor.

In certain other embodiments of the present disclosure, when the first stress layer 410 is being formed using a selective epitaxial deposition process, gas containing P-type dopants can be introduced into the reaction chamber. That is, an in-situ doping process can be used to dope P-type dopants to the first stress layer 410. The P-type dopants can be B and/or Ga. By using the in-situ doping process, damages to the surface of the first stress layer 410 can be prevented or reduced.

In some embodiments of the present disclosure, when the first stress layer 410 fills up the first trenches 401 and the surface of the first stress layer 410 is coplanar with the surface of the semiconductor substrate 100, the selective epitaxial deposition process can be stopped. In certain other embodiments of the present disclosure, the surface of the first stress layer 410 can also be slightly higher or slightly lower than the surface of the semiconductor substrate 100.

The subsequently-formed first bumping stress layer can be formed on the first stress layer 410 and can have a surface higher than the surface of the semiconductor substrate 100. A silicide layer can be formed on the first bumping stress layer. The distance between the silicide layer and the channel region of the transistor can be increased to prevent/reduce stress exerted on the channel region by the silicide layer. Adverse effects on the electrical properties and performance of the transistor can be prevented or reduced.

Figure 6:
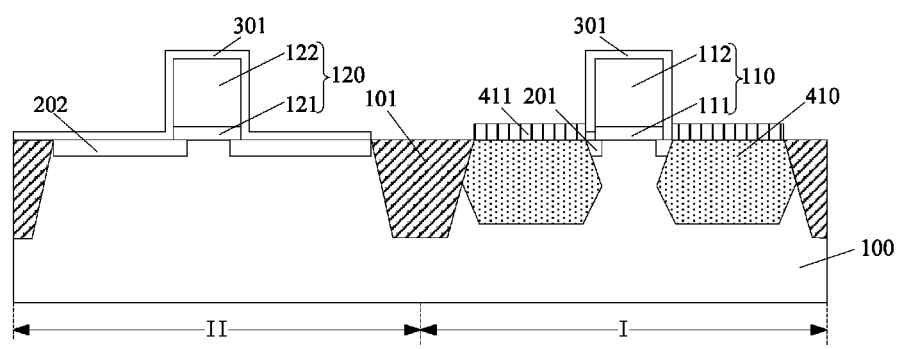

Returning to FIG. 13, after the first stress layer is formed in the first trenches, a first bumping stress layer is formed on the first stress layer, and an in-situ doping process is used to dope the first bumping stress layer with first dopants (S106). FIG. 6 illustrates a corresponding semiconductor structure.

As shown in FIG. 6, a first bumping stress layer 411 can be formed on the first stress layer 410, and an in-situ doping process can be used to dope the first bumping stress layer 411 with first dopants.

In one embodiment, a selective deposition process, same as the selective deposition process to form the first stress layer 410, can be used to form the first bumping stress layer 411 on the first stress layer 410. Gas containing first dopants can be introduced into the reaction chamber during the selective deposition process such that the first bumping stress layer 411 can be doped with first dopants by the in-situ doping process. Also, by using the in-situ doping process to dope first dopants into the first bumping stress layer 411, damages to the crystal lattice of the first bumping stress layer 411 can be prevented. Interface quality between the first bumping stress layer 411 and the subsequently-formed first silicide layer can be improved. Contact resistance between the subsequently-formed first silicide layer and the first bumping stress layer 411 can be reduced. Compared to an ion implantation process for forming the first bumping stress layer 411, no additional mask is needed for the in-situ doping process, and the fabrication cost can be desirably low.

The first bumping stress layer 411 and the first stress layer 410 can be made of a same material, such as SiGe. When the first silicide layer is subsequently formed on the first bumping stress layer 411, the thickness of the first bumping stress layer 411 can be sufficiently thick to react with metal layer and form the first silicide layer to prevent the metal layer from reacting with the first stress layer 410 under the first bumping stress layer 411. A distance can be formed between the first silicide layer and the channel region under the first gate structure 110.

The first bumping stress layer 411 can also be doped with P-type dopants. A gas containing P-type dopants can be introduced into the reaction chamber when the first bumping stress layer 411 is being formed. Thus, the first bumping stress layer 411 can be doped with P-type dopants.

The first dopants can be Al and/or In. The gas containing the first dopants can be a gas containing Al and/or In, such as $AlCl_3$, $InCl_3$, and/or $AlH_3$.

In one embodiment, the gas containing the first dopants can be introduced into the reaction chamber from the beginning of the deposition process to form the first bumping stress layer 411 such that the first dopants can be uniformly distributed in the first bumping stress layer 411. The flow rate of the gas containing the first dopants can be about 50 sccm to about 200 sccm to ensure the dopant concentration of the first dopants can be sufficiently high in the first bumping stress layer 411 such that the Schottky barrier between the first bumping stress layer 411 and the subsequently-formed first silicide layer can be decreased. In one embodiment, the dopant concentration of the first dopants can be about $1E15$ $cm^{-3}$ to about $1E17$ $cm^{-3}$.

In certain other embodiments of the present disclosure, when the thickness of the first bumping stress layer 411 reaches a certain value, the gas containing the first dopants can be stopped from introducing into the reaction chamber. The deposition of the first bumping stress layer 411 may continue. Thus, only the portion of the first bumping stress layer 411 near the interface with the first stress layer 410 is doped with first dopants. The thickness of the doped portion (i.e., with the first dopants) of the first bumping stress layer 411 can be about ¼ to about ¾ of the total thickness of the first bumping stress layer 411.

Figure 7:
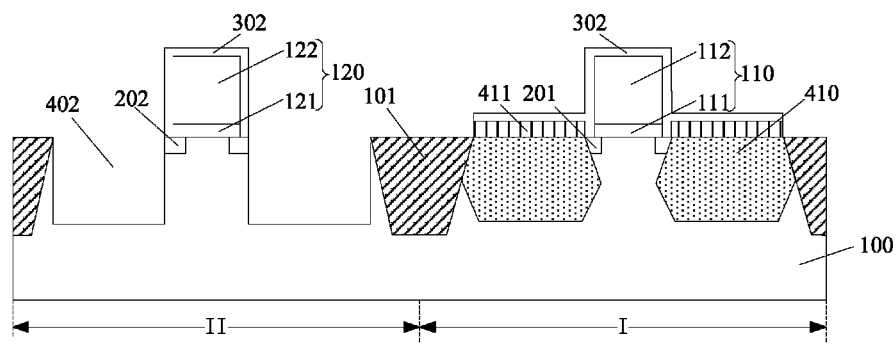

Returning to FIG. 13, after the first bumping stress layer is formed on the first stress layer and doped with first dopants by using the in-situ doping process, second trenches can be formed in the second region II at both sides of the second gate structure (S107). FIG. 7 illustrates a corresponding semiconductor structure.

As shown in FIG. 7, second trenches 402 can be formed in second region II at both sides of the second gate structure 120.

Specifically, to form second trenches 402, the first mask layer 301 (as shown in FIG. 6) can be removed, and a second mask layer 302 can be formed to cover the first region I and the second gate structure 120. The second mask layer 302 can be used as the etch mask to etch the portions of the second region II at both sides of the second gate structure 120 to form the second trenches 402.

Portions of the second region II at both sides of the second gate structure 120 can be etched by a dry etch process to form second trenches 402 with sidewalls vertical with respect to the surface of the semiconductor substrate. In one embodiment, an N-type FET can be formed on the second regions II. The carriers in the N-type FET are electrons, and the electron mobility is higher than the hole mobility in the substrate 100. When the sidewalls of a second trench 402 are vertical with respect to the surface of the substrate 100, the subsequently-formed second stress layer in the second trenches 402 can exert less stress on the corresponding channel region compared to the stress exerted on a channel region by the first stress layer 410 on the first region I. Thus, the carrier mobility in the first region can be close to the carrier mobility in the second region.

In certain other embodiments of the present disclosure, second trenches 402 with "Σ"-shaped sidewalls can also be formed at both sides of the second gate structure 120 on the second region II. The second trenches 402 can be formed through the same method for forming the first trenches 401 (as shown in FIG. 4).

Figure 8:
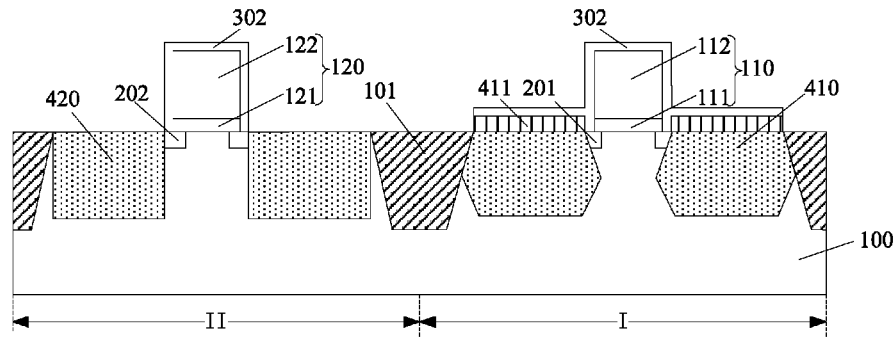

Returning to FIG. 13, after second trenches are formed in the second region II at both sides of the second gate structure, a second stress layer is formed in the second trenches (S108). FIG. 8 illustrates a corresponding semiconductor structure.

As shown in FIG. 8, the second stress layer 420 can be formed in the second trenches 402.

The second stress layer 420 can be formed using a selective deposition process.

In one embodiment, an N-type FET can be formed on the second regions. The first stress layer 420 can be made of SiC or Si. When the second stress layer 420 is made of SiC, the second stress layer 420 can exert tensile stress on the channel region under the second gate structure 120 to improve/increase the electron mobility in the channel region. The electrical properties and performance of the N-type FET can be improved accordingly.

In one embodiment, the second stress layer 420 can be made of SiC. A selective epitaxial deposition process can be used to form the SiC second stress layer 420. The reactant gases can include a silicon-source gas and a carbon-source gas. The silicon-source gas may be $SiH_4$ and/or $SiH_2Cl_2$, and the carbon-source gas may be $CH_4$. The reactant gases can further include HCl gas and $H_2$ gas. The flow rate of the silicon-source gas, the carbon-source gas, and the HCl gas can each be about 10 sccm to about 1000 sccm; and the flow rate of the $H_2$ gas can be about 0.1 slm to about 50 slm.

In one embodiment, after the second stress layer 420 is formed using the selective epitaxial deposition process, a heavy ion implantation process can be performed to dope N-type dopants into the second stress layer 420 such that the second stress layer 420 can be doped with N-type dopants. The second stress layer 420 can be the source and drain regions of the subsequently-formed transistor (e.g., a FET).

In certain other embodiments of the present disclosure, when the second stress layer 420 is being formed by the selective epitaxial deposition process, gas containing N-type dopants can be introduced into the reaction chamber such that an in-situ doping process can be used to dope the second stress layer 420 with N-type dopants. The N-type dopants can be P, As, and/or other suitable dopants. By using the in-situ doping process to dope the N-type dopants, damages to the surface of the second stress layer 420 can be prevented/reduced.

In one embodiment, when the second trenches 402 are filled up with the second stress layer 420 and the surface of the second stress layer 420 is coplanar with the surface of the semiconductor substrate 100, the selective epitaxial deposition process can be stopped. In certain other embodiments of the present disclosure, the surface of the second stress layer 420 can also be slightly higher or slightly lower than the surface of the semiconductor substrate 100.

When a second bumping stress layer is subsequently formed on the second stress layer 420, the surface of the second bumping stress can be higher than the surface of the semiconductor substrate 100. A second silicide layer can be formed on the second bumping stress layer. Thus, the distance between the second silicide layer and the channel region of the transistor can be increased to prevent the second silicide layer from exerting stress on the channel region of the transistor. Adverse effect on the electrical properties and performance of the transistor can be reduced/prevented.

Figure 9:
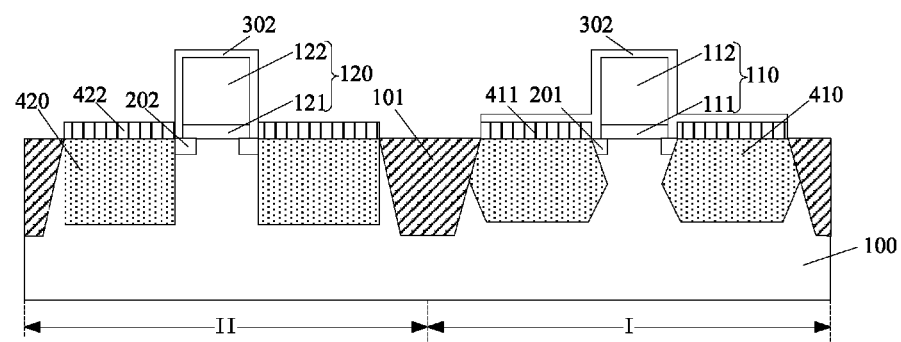

Returning to FIG. 13, after the second stress layer is formed in the second trenches, a second bumping stress layer is formed on the second stress layer and doped with second dopants by using an in-situ doping process (S109). FIG. 9 illustrates a corresponding semiconductor structure.

As shown in FIG. 9, a second bumping stress layer 422 can be formed on the second stress layer 420, and an in-situ doping process can be used to dope the second bumping stress layer 422 with second dopants.

In one embodiment, same deposition processes can be used to form the second stress layer 420 and the second bumping stress layer 422 on the second stress layer 420. A gas containing the second dopants can be introduced into the deposition chamber when the second bumping stress layer 422 is being formed, such that an in-situ doping can be used to dope the second bumping stress layer 422 with the second dopants. By using the in-situ doping process to dope the second bumping stress layer 422 with the second dopants, damages to the crystal lattice of the second bumping stress layer 422 can be prevented, and the interface between the second bumping stress layer 422 and the subsequently-formed second silicide layer can have improved quality. Contact resistance between the second bumping stress layer 422 and the subsequently-formed silicide layer can be reduced. Compared to using an ion implantation as the doping process, the in-situ doping process requires no additional mask and fabrication cost can be low.

The second bumping stress layer 422 and the second stress layer 420 can be made of a same material. In one embodiment, the second bumping stress layer 422 and the second stress layer 420 can both be made of SiC. When the second silicide layer is formed on the second bumping stress layer 422, the second bumping stress layer 422 may need to be sufficiently thick to form the second silicide layer and prevent the metal layer from reacting with the second stress layer 420 under the second bumping stress layer 422. A distance can be formed between the second silicide layer and the channel region under the second gate structure 120.

The second bumping stress layer 422 can also be doped with N-type dopants. Gas containing N-type dopants can be introduced into the reaction chamber when the second stress layer 411 is being formed. The second bumping stress layer 422 can then be doped with N-type dopants.

The second dopants can be Al, Se, Sb, and/or Te. The gas containing the second dopants can include $AlCl_3$, $SeCl_3$, $SbCl_2$, and/or $TeCl_2$.

In one embodiment, during the selective deposition process, when the thickness of the second bumping stress layer 422 reaches a certain value, the gas containing the second dopants can be introduced into the reaction chamber such that the portion of the second bumping dopants doped with the second dopants can have a depth smaller than the total thickness of the second bumping stress layer 422. The portion of the second bumping dopants doped with the second dopants can form a second ion doped region 422a in the second bumping stress layer 422. Meanwhile, the depth of the second ion doped region 422a in the second region II can be less than the depth of the portion of the first bumping stress layer doped with the first dopants in the first region I. For example, the second dopants can be doped into the second bumping stress layer 422 from the surface of the second bumping stress layer 422 to about ½ of the total thickness of the second bumping stress layer 422. Since the depth of the second ion doped region is sufficiently small, when the subsequently-formed second silicide layer is being formed, the portion of the second bumping stress layer 422 doped with the second dopants can react with the metal layer such that the second dopants can all be confined within the second silicide layer. The work function of the silicide layer can be effectively reduced, and the Schottky barrier between the second silicide layer and the second bumping stress layer 422 can be reduced. Thus, contact resistance between the second silicide layer and the second bumping stress layer 422 can be reduced.

The flow rate of the gas containing the second dopants can be about 50 sccm to about 200 sccm. The dopant concentration of the second dopants in the second bumping stress layer 422 can be sufficiently high to reduce the Schottky barrier between the second bumping stress layer 422 and the subsequently-formed second silicide layer. In one embodiment, the dopant concentration of the second dopants in the second ion doped region can be about $1E15$ $cm^{-3}$ to about $1E17$ $cm^{-3}$.

Figure 10:
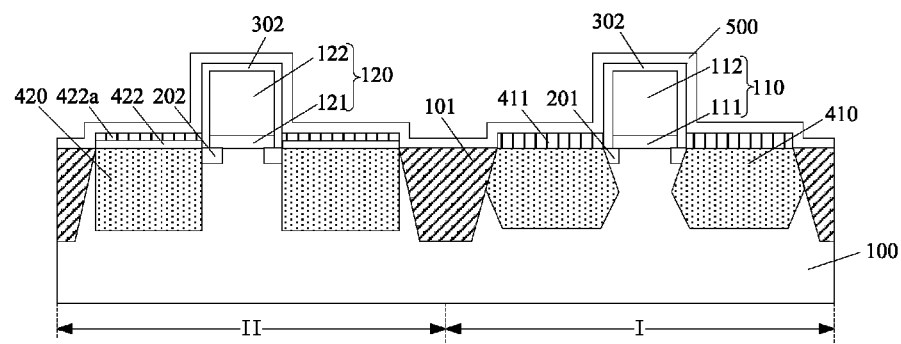

Returning to FIG. 13, after the second bumping stress layer is formed on the second stress layer and doped with second dopants by using the in-situ doping process, a metal layer can be formed on the first bumping stress layer and the second bumping stress layer (S110). FIG. 10 illustrates a corresponding semiconductor structure.

As shown in FIG. 10, a metal layer 500 can be formed on the first bumping stress layer 411 and the second bumping stress layer 422.

Before the metal layer 500 is formed, portions of the second mask layer 302 on the first bumping stress layer 411 (as shown in FIG. 9) can be removed to expose the surface of the first bumping stress layer 411 in the first region I. The metal layer 500 can be formed on the first bumping stress layer 411 and the second bumping stress layer 422. The metal layer 500 may also cover other regions on the semiconductor substrate 100.

The metal layer 500 can be formed by a sputtering process, an evaporation process, an atomic layer deposition process, a chemical vapor deposition process, and/or other suitable deposition processes. The metal layer 500 can be made of Ti, Al, La, Zn, and/or Ni. The metal layer can have a thickness of about 0.5 nm to about 2 nm to ensure sufficient metal is provided to form the first silicide layer and the second silicide layer with desirable thicknesses.

The second mask layer 302 may be remained between the metal layer 500 and the first gate structure 110 and between the metal layer 500 and the second gate structure 120. The second mask layer 302 can isolate the metal layer 500 from the first gate structure 110 and the second gate structure 120 in the subsequent thermal annealing process, such that reaction between the metal layer 500 and the first gate electrode 112 and reaction between the metal layer 500 and the second gate electrode 122 can be prevented.

Returning to FIG. 13, after the metal layer is formed on the first bumping stress layer and the second bumping stress layer, a thermal annealing process is performed to enable the formation of the first silicide layer on the first bumping stress layer by the reaction between the metal layer and the first bumping stress layer, and the formation of the second silicide layer on the second bumping stress layer by the reaction between the metal layer and the second bumping stress layer (S111). FIG. 11 illustrates a corresponding semiconductor structure.

As shown in FIG. 11, a thermal annealing process can be used to enable the formation of the first silicide layer 501 on the first bumping stress layer 411 by the reaction between the metal layer 500 and the first bumping stress layer 411, and formation of the second silicide layer 502 on the second bumping stress layer by the reaction between the metal layer 500 and the second bumping stress layer 422.

The thermal annealing process can have an annealing temperature of about 250 degrees Celsius to about 800 degrees Celsius, and an annealing time of about 30 seconds to about 90 seconds. The thermal annealing process can be performed in vacuum or in inert gas ambient. The thermal annealing process can be a furnace annealing, a rapid thermal annealing, and/or a spike annealing. Under the annealing temperature, the metal layer 500 can react with the first bumping stress layer 411 and the second bumping stress layer 422 to form the first silicide layer 501 and the second silicide layer 502. In one embodiment, metal atoms in the metal layer 500 can preferentially form chemical bonds with the silicon atoms in the first bumping stress layer 411 and the second bumping stress layer 422 to form metal silicide layer. In one embodiment, the metal layer 500 can be made of nickel, and the first silicide layer 501 and the second silicide layer 502 can be made of nickel silicon.

In one embodiment, the metal layer 500 may react with only a portion of the first bumping stress layer 411 and a portion of the second bumping stress layer 422. The portion of the reacted first bumping stress layer 411 and the portion of the reacted second bumping stress layer 422 can each have a thickness greater than the thickness of the second ion doped region 422a in the second bumping stress layer 422 (as shown in FIG. 10).

Since the first bumping stress layer 411 can be doped with the first dopants, after the metal layer 500 reacts with the first bumping stress layer 411, the first silicide layer 501 can also contain the first dopants. Meanwhile, since the first bumping stress layer 411 can be formed on the first stress layer 410, the first dopants can be close to the surface of the first stress layer 410. During the thermal annealing process, some first dopants can diffuse into the first stress layer 410. The first dopants can thus be contained in both the first silicide layer 501 and the first bumping stress layer 411. Since the first dopants can be group III elements such as Al and/or In, acceptor concentrations in the first bumping stress layer 411 and the first stress layer 410 can be increased. Potential wells can be formed on the surface of the first bumping stress layer 411, and electrons in the first silicide layer 501 can diffuse to the first bumping stress layer 411. Electrons may accumulate at the side of the first bumping stress layer 411, and the number of holes may increase at the side of the first silicide layer 501. A sufficiently strong electrical field may be formed in the interface between the first bumping stress layer 411 and the first silicide layer 501. The width of the Schottky barrier between the first silicide layer 501 and the first bumping stress layer 411 can be reduced such that carries in the first bumping stress layer 411 can easily tunnel into the first silicide layer 501. The height of the Schottky barrier between the first silicide layer 501 and the first bumping stress layer 411 can be reduced, and the contact resistance between the first bumping stress layer 411 and the first silicide layer 501 can be reduced accordingly.

In certain other embodiments of the present disclosure, the entire first bumping stress layer 411 can react with the metal layer 500 to form the first silicide layer 501. Some of the first dopants in the first bumping stress layer 411 can diffuse into the first stress layer 410 such that the first silicide layer 501 and the first stress layer 401 can both contain the first dopants. The height of the Schottky barrier between the first stress layer 410 and the first silicide layer 501 can be reduced, and the contact resistance between the first stress layer 410 and the first silicide layer 501 can be reduced accordingly.

When the second silicide layer 502 is being formed, since the portion of the second bumping stress layer 422 reacting with the metal layer can have a thickness greater than the thickness of the second ion doped region 422a in the second bumping stress layer 422 (as shown in FIG. 10), the second dopants can be contained in the second silicide layer 502. The second silicide layer 502 can thus be doped with the second dopants. In addition, in one embodiment, the second stress layer 420 and the second bumping stress layer 422 can be made of SiC. The carbon ions can prevent diffusion of the second dopants such that the second dopants may not diffuse outward beyond the bumping stress layer 422 during the formation of the second silicide layer 502 by thermal annealing. After the second silicide layer 502 is formed, the second dopants can be entirely confined in the second silicide layer 502. The second dopants can be Al, Se, Sb, and/or Te. The second dopants can reduce the work function of the second silicide layer 502, and therefore reduce the difference between the work function of the second silicide layer 502 and the work function of the second bumping stress layer 422. The height of the Schottky barrier between the second silicide layer 502 and the second bumping stress layer 422 can be reduced, and the contact resistance between the second silicide layer 502 and the second bumping stress layer 422 can be reduced accordingly.

Returning to FIG. 13, after the first silicide layer and the second silicide layer are formed by the thermal annealing process, the unreacted portion of the metal layer is removed (S112). FIG. 12 illustrates a corresponding semiconductor structure.

As shown in FIG. 12, the unreacted portion of the metal layer 500 can be removed.

A wet etch process can be used to remove the remaining metal layer 500. The solution of the wet etch process can be a mixed solution containing phosphoric acid, nitric acid, and/or acetic acid. In other various embodiments of the present disclosure, any suitable wet etch solution can be chosen according to the material of the metal layer 500. The wet etch solution can have desirably high etch rate selectivity on the metal layer 500 over the silicide layers. When the metal layer 500 is being etched, etching damages to the first silicide layer 501 and the second silicide layer 502 can be prevented or reduced.

In the disclosed embodiments of the present disclosure, in-situ doping processes can be used to dope the first bumping stress layer with the first dopants and dope the second bumping stress layer with the second bumping stress layer. The first silicide layer can be formed on the first bumping stress layer and the second silicide layer can be formed on the second bumping stress layer. Since the first dopants can reduce the height of the Schottky barrier between the first silicide layer and the first bumping stress layer, and the second dopants can reduce the height of the Schottky barrier between the second silicide layer and the second bumping stress layer, the fabrication methods described above can reduce the contact resistance between the first silicide layer and the first bumping stress layer and the contact resistance between the second silicide layer and the second bumping stress layer. The electrical properties and the performance of the semiconductor structures can be improved accordingly. Meanwhile, in one embodiment, in-situ doping processes can be used to dope the first bumping stress layer with the first dopants and dope the second bumping stress layer with the second dopants, damages to the crystal lattices of the first bumping stress layer and the second bumping stress layer can be prevented. The interface between the first bumping stress layer and the first silicide layer and the interface between the second bumping stress and the second silicide layer can both have improved quality. The contact resistance between the first bumping stress layer and the first silicide layer can be further reduced, and the contact resistance between the second bumping tress layer and the second silicide layer can also be further reduced.

Compared to a conventional transistor, the fabrication method provided in the current disclosure has the following advantages.

The present disclosure provides a semiconductor fabrication method. A semiconductor substrate is provided to including first regions, second regions, first gate structures covering portions of a first region, and second gate structures covering portions of a second region. First trenches are formed in a first region at both sides of each first gate structure. A first stress layer is formed in the first trenches and a first bumping stress layer is formed on the first stress layer. The first bumping stress layer is doped with first dopants by an in-situ doping process. Second trenches are formed in a second region at both sides of each second gate structure. A second stress layer is formed in the second trenches and a first bumping stress layer is formed on the first stress layer. The second bumping stress layer is doped with second dopants by an in-situ doping process. A first silicide layer is formed on the first bumping stress layer, and a second silicide layer is formed on the second bumping stress layer.

Because the first dopants can reduce the height of the Schottky barrier between the first silicide layer and the first bumping stress layer, and the second dopants can reduce the height of the Schottky barrier between the second silicide layer and the second bumping stress layer, the fabrication methods disclosed can reduce the contact resistance between the first silicide layer and the first bumping stress layer and reduce the contact resistance between the second silicide layer and the second bumping stress layer. Electrical properties and performance of the semiconductor structure can be improved. Further, in-situ doping processes are used to dope the first bumping stress layer with the first dopants and dope the second bumping stress layer with the second dopants, and damages to the crystal lattices of the first bumping stress layer and the second bumping stress layer are prevented. The interface between the first bumping stress layer and the first silicide layer may have improved quality, and the interface between the second bumping stress and the second silicide layer may also have improved quality. The contact resistance between the first bumping stress layer and the first silicide layer and the contact resistance between the second bumping tress layer and the second silicide layer may both be further reduced. No additional mask layer is required and fabrication/manufacturing cost can be low.

Further, after the first silicide layer and the second silicide layer are formed, some first dopants are distributed in the first silicide layer, and some first dopants are distributed in the first bumping stress layer under the silicide layer. The first dopants can be Al or In, such that acceptor concentrations in the first bumping stress layer and the first stress layer can be increased. Potential wells are formed at the surface of the first bumping stress layer. Electrons in the first silicide layer diffuse in a direction to the first bumping stress layer. Electrons in the first silicide layer diffuse in a direction to the first bumping stress layer such that electrons accumulate at the side of the first bumping layer and holes accumulate at the side of the first silicide layer. A sufficiently strong electrical field may be formed in the interface between the first bumping stress layer and the first silicide layer. The width of the Schottky barrier between the first silicide layer and the first bumping stress layer can be reduced such that carries in the first bumping stress layer can easily tunnel into the first silicide layer. The height of the Schottky barrier between the first silicide layer and the first bumping stress layer can be reduced, and the contact resistance between the first bumping stress layer and the first silicide layer can be reduced accordingly.

Furthermore, the second dopants can be confined entirely in the second silicide layer. The second dopants can be Al, Se, Sb, and/or Te. The second dopants can reduce the work function of the second silicide layer, and therefore reduce the difference between the work function of the second silicide layer and the work function of the second bumping stress layer. The height of the Schottky barrier between the second silicide layer and the second bumping stress layer can be reduced, and the contact resistance between the second silicide layer and the second bumping stress layer can be reduced accordingly.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims

What is claimed is:

1. A semiconductor fabrication method, comprising:
providing a semiconductor substrate having first regions and second regions;
providing a first gate structure on a first region of the semiconductor substrate, and a second gate structure on a second region of the semiconductor substrate;
forming first trenches in the first region at both sides of the first gate structure;
forming a first stress layer in the first trenches and a first bumping stress layer on the first stress layer, wherein the first bumping stress layer is doped with first dopants including Al, In, or a combination thereof;
forming second trenches in a second region at both sides of the second gate structure;
forming a second stress layer in the second trenches and a second bumping stress layer on the second stress layer, wherein the second bumping stress layer is doped with second dopants;
forming a metal layer on the first bumping stress layer and the second bumping stress layer; and
performing a thermal annealing process such that the metal layer reacts with the first bumping stress layer to form a first silicide layer on the first bumping stress layer and the metal layer reacts with the second bumping stress layer to form a second silicide layer on the second bumping stress layer.

2. The method according to claim 1, wherein the second dopants are Al, Se, Sb, Te, or a combination thereof.

3. The method according to claim 2, wherein a doping concentration of the first dopants is about $1E15$ cm$^{-3}$ to about $1E17$ cm$^{-3}$, and a doping concentration of the second dopants is about $1E15$ cm$^{-3}$ to about $1E17$ cm$^{-3}$.

4. The method according to claim 3, wherein a doping depth of the second dopants is less than a doping depth of the first dopants.

5. The method according to claim 4, wherein:
after the first silicide layer and the second silicide layer are formed, each of the first silicide layer and the first bumping stress layer under the first silicide layer includes a portion of the first dopants, and second dopants are entirely confined in the second silicide layer.

6. The method according to claim 1, wherein the steps for forming the first trenches, the first stress layer, and the first bumping stress layer include:
forming a first mask layer to cover the second regions and first gate structures before forming the first trenches;
using the first mask layer as an etch mask for etching portions of the first regions at both sides of each first gate structure to form first trenches;
using a selective deposition process to form the first stress layer to fill up the first trenches; and
using a selective deposition process to form the first bumping stress layer on the first stress layer, wherein a gas containing first dopants is introduced into the selective deposition process to dope the first bumping stress layer with first dopants.

7. The method according to claim 6, wherein the step for forming the first trenches include:
etching portions of the first region at both sides of each first gate structure by using a dry etch process to form openings; and
etching the openings by using an isotropic wet etch process to form first trenches, wherein a sidewall of a first trench has a "Σ" shape.

8. The method according to claim 1, wherein the steps for forming the second trenches, the second stress layer, and the second bumping stress layer include:
forming a second mask layer to cover the first regions and second gate structures before forming the second trenches;
using the second mask layer as an etch mask to etch portions of the second regions at both sides of each second gate structure to form second trenches;
using a selective deposition process to form the second stress layer to fill up the second trenches; and
using a selective deposition process to form the second bumping stress layer on the second stress layer, wherein a gas containing second dopants is introduced into the selective deposition process to dope the second bumping stress layer with second dopants.

9. The method according to claim 8, wherein portions of the second region at both sides of each second gate structure are etched by using a dry etch process to form second trenches.

10. The method according to claim 8, wherein a doping depth of the second dopants is less than a total thickness of the second bumping stress layer.

11. The method according to claim 8, wherein after a thickness of the second bumping stress layer reaches a certain portion of the total thickness of the second bumping stress layer by the selective deposition process, a gas containing second dopants is introduced into the selective deposition process to dope the second bumping stress layer with second dopants.

12. The method according to claim 1, wherein, before forming the first trenches and the second trenches, the method further includes:
doping portions of a first region at both sides of each first gate structure with a first light ion implantation process and a first pocket ion implantation process; and
doping portions of a second region at both sides of each second gate structure with a second light ion implantation process and a second pocket ion implantation process.

13. The method according to claim 1, wherein the first stress layer and the first bumping stress layer are doped with P-type dopants.

14. The method according to claim 1, wherein the second stress layer and the second bumping stress layer are doped with N-type dopants.

15. The method according to claim 1, wherein the metal layer is made of Ti, Al, La, Zn, Ni, or a combination thereof.

16. The method according to claim 15, wherein a thermal annealing temperature of the thermal annealing process is about 250 degrees Celsius to about 800 degrees Celsius; and a thermal annealing time is about 30 seconds to about 90 seconds.

17. A semiconductor device, comprising:
a semiconductor substrate having first regions;
a first gate structure on a first region of the semiconductor substrate;
a first stress layer in a first region and at both sides of each first gate structure;
a first bumping stress layer on the first stress layer, above a top surface of the semiconductor substrate, and doped with first dopants; and
a first silicide layer on the first bumping stress layer and over the top surface of the semiconductor substrate, wherein the first dopants include Al, In, or a combination thereof and are distributed in the first silicide layer and the first bumping stress layer.

18. The semiconductor device according to claim 17, wherein the first stress layer and the first bumping stress layer are made of SiGe.

19. The method according to claim 1, wherein the first bumping stress layer and the second bumping stress layer are doped by an in-situ doping process.

20. The method according to claim 5, wherein carbon ions prevent diffusion of the second dopants such that the second dopants do not diffuse outward beyond the bumping stress layer during the formation of the second silicide layer by thermal annealing and the second dopants are entirely confined in the second silicide layer.

21. The semiconductor device according to claim 17, wherein:
the semiconductor substrate further includes second regions,
a second gate structure is on a second region of the semiconductor substrate,
a second stress layer is in a second region of the semiconductor substrate and at both sides of each second gate structure,
a second bumping stress layer is on the second stress layer, above a top surface of the semiconductor substrate, and doped with second dopants, and
a second silicide layer is on the second bumping stress layer and over the semiconductor substrate, wherein the second dopants are distributed in the second silicide layer and the second bumping stress layer.

22. The semiconductor device according to claim 21, wherein the second stress layer and the second bumping stress layer are made of SiC, Si, or a combination of SiC and Si.

* * * * *